(12) United States Patent
Kawasaki et al.

(10) Patent No.: US 7,081,641 B2
(45) Date of Patent: Jul. 25, 2006

(54) SEMICONDUCTOR DEVICE AND MANUFACTURING METHOD THEREOF

(75) Inventors: Masahiro Kawasaki, Tsukuba (JP); Shuji Imazeki, Hitachi (JP); Masahiko Ando, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/786,097

(22) Filed: Feb. 26, 2004

(65) Prior Publication Data
US 2005/0056897 A1 Mar. 17, 2005

(30) Foreign Application Priority Data
Sep. 12, 2003 (JP) .............................. 2003-321870

(51) Int. Cl.
*H01L 29/08* (2006.01)
(52) U.S. Cl. .......................... 257/40; 257/57; 257/66; 257/347
(58) Field of Classification Search ................ 257/40, 257/57, 66, 347, 773; 438/158, 161
See application file for complete search history.

(56) References Cited

U.S. PATENT DOCUMENTS

| | | | |
|---|---|---|---|
| 6,569,707 B1 * | 5/2003 | Dimitrakopoulos et al. | .. 438/99 |
| 6,858,527 B1 * | 2/2005 | Gracias | ....................... 438/628 |
| 2005/0056897 A1 * | 3/2005 | Kawasaki et al. | .......... 257/359 |

FOREIGN PATENT DOCUMENTS

JP  2000-307172  11/2000

OTHER PUBLICATIONS

IEEE Transaction on Electron Device, vol. 48, No. 6, p. 1060-1064, Jun. 2001.

* cited by examiner

*Primary Examiner*—Mark V. Prenty
(74) *Attorney, Agent, or Firm*—Antonelli, Terry, Stout and Kraus, LLP.

(57) ABSTRACT

An object of the present invention is to provide a semiconductor device such as a display device, ID tag, sensor or the like at low cost by using a bottom contact type organic TFT as a switching element. In the present invention, the semiconductor layer of the bottom contact type organic TFT is formed of a polycrystalline material, and the taper width of each of the source and drain electrodes of the TFT in the direction of the channel length is smaller than the average particle size of semiconductor crystals grown on the source and drain electrodes. Alternatively, the side on the channel side of each of the source and drain electrodes of the bottom contact type organic TFT is formed so as to be convex upward with respect to the substrate surface. Alternatively, an organic compound layer different from the semiconductor layer of the bottom contact type organic TFT is made present between each of the source and drain electrodes of the bottom contact type organic TFT and said semiconductor layer, in a thickness of not more than 10 Å and not less than 1 Å.

25 Claims, 6 Drawing Sheets

SMALLER TAPER WIDTH

LARGER TAPER WIDTH

SEMICONDUCTOR DEVICE AND MANUFACTURING METHOD THEREOF

BACKGROUND OF THE INVENTION

The present invention relates to the improvement of the performance characteristics of a thin-film transistor. It relates to, in particular, a method for reducing contact resistance made on the boundary surface between an electrode and a semiconductor.

With transformation into an information society, there is noted the development of, for example, thin and light electronic paper as a substitute for paper and ID tags that permit momentary discrimination of commodities from one another. At present, in these devices, a thin-film transistor (TFT) obtained by using amorphous silicon (a-Si) or polycrystalline silicon (p-Si) as a semiconductor is used as a switching element. However, the production of TFT using such a silicon semiconductor entails a great cost because it requires a plasma chemical vapor deposition (CVD) apparatus, a sputtering apparatus and the like, which are expensive. Moreover, the TFT is produced through many processes such as vacuum process, photolithography, processing, etc., resulting in a low throughput.

Therefore, there is noted organic TFT obtained by using as a semiconductor layer an organic material which can be formed by printing and makes it possible to provide a product at low cost. JP-A-2000-307172 discloses a bottom contact structure as a typical structure of organic TFT. It is known that organic semiconductor materials are generally inferior to inorganic semiconductors in chemical resistance and heat resistance. Electrodes and an insulating film are formed by a high-temperature process and wet etching or a coating process. Therefore, in the case of organic TFT comprising a mixture of an organic semiconductor, a metal for electrodes, and another organic material for an insulating film or the like, an organic semiconductor film is liable to be deteriorated during a process of forming individual layers. For these reasons, the bottom contact structure formed by forming an organic semiconductor layer after forming a gate electrode, a gate insulator, a source electrode and a drain electrode on an insulating substrate is suitable for organic TFT.

IEEE TRANSACTION ON ELECTRON DEVICE, VOL. 48, NO. 6, p. 1060 reports the following: in organic TFT having the bottom contact structure, a gold source electrode and a gold drain electrode are modified with a self-aligning monomolecular film (SAM) of a thiol to change the surface energy of the gold and increase the particle size of pentacene crystals grown on the electrodes, whereby the mobility in the TFT is increased.

In the case of the bottom contact structure described above, when the semiconductor layer is formed of an organic material capable of undergoing polycrystal growth, such as pentacene, the size of semiconductor crystals on the source and drain electrodes is less than one-tenth that on the insulating film. As a result, there is the following problem: a large number of grain boundaries are present in a channel region near the boundary between each of the source and drain electrodes and the semiconductor, so that the contact resistance on the boundary surface between each of the source and drain electrodes and the semiconductor is increased. Carriers present between the source electrode and the drain electrode and on the boundary surface between the organic semiconductor layer and the gate insulator on the gate electrode assume an accumulated state or a depleted state, depending on the polarity and magnitude of a voltage applied to the gate electrode, so that they modulate the electric current between the source electrode and the drain electrode. The current path of about 10 nm in thickness described above is a channel.

When the gold surface is densely modified with SAM of a thiol, the work function of the gold is decreased by about 0.5 eV, so that the Schottky barrier on the boundary surface between gold and pentacene is undesirably increased. Moreover, when the gold electrode is modified with molecules with a large molecular length of octadecanethiol or the like, the distance between gold and pentacene is increased, so that the injection of carriers into the semiconductor from the electrode is undesirably disturbed.

An object of the present invention is to provide a high-performance semiconductor device obtained by reducing the contact resistance on the boundary surface between each of source and drain electrodes and semiconductor of organic TFT having the bottom contact structure, and using the organic TFT as a switching element.

SUMMARY OF THE INVENTION

In order to achieve the above object, the present invention is characterized by the following: in a semiconductor device using a switching element obtained by laminating a gate electrode, a gate insulator, a source electrode, a drain electrode, a semiconductor layer and a protective insulating film in that order on an insulating substrate, said semiconductor layer is formed of a polycrystalline material, each of said source and drain electrodes has a taper portion, and the length of said taper portion in the direction of the channel length is smaller than the average particle size of semiconductor crystals on each of said source and drain electrodes.

In addition, the present invention is characterized by the following: in a semiconductor device using a thin-film transistor obtained by laminating a gate electrode, a gate insulator, a source electrode, a drain electrode and a semiconductor layer in that order on an insulating substrate, said semiconductor layer is formed of a polycrystalline material, and the center of semiconductor crystals in contact with at least a region of the side on the channel side of each of said source and drain electrodes, which region has a height of 3 nm or less above the gate insulator, is on the gate insulator.

The present invention is characterized also by the following: in a semiconductor device using a switching element obtained by laminating a gate electrode, a gate insulator, a source electrode, a drain electrode, a semiconductor layer and a protective insulating film in that order on an insulating substrate, the shape of the side on the channel side of each of said source and drain electrodes is convex upward with respect to the substrate surface.

The present invention is further characterized by the following: in a semiconductor device using a switching element obtained by laminating a gate electrode, a gate insulator, a source electrode, a drain electrode, a semiconductor layer and a protective insulating film in that order on an insulating substrate, each of said source and drain electrodes has a reverse-taper portion.

The present invention is still further characterized by the following: in a semiconductor device using a switching element obtained by laminating a gate electrode, a gate insulator, a source electrode, a drain electrode, a semiconductor layer and a protective insulating film in that order on an insulating substrate, an organic compound layer different from said semiconductor layer is present between each of said source and drain electrodes and said semiconductor layer, and the average thickness of the organic compound layer is not more than 10 Å and not less than 1 Å.

The present invention is still further characterized by the following: in a semiconductor device using a thin-film transistor obtained by laminating a gate electrode, a gate insulator, a source electrode, a drain electrode, a semiconductor layer and a protective insulating film in that order on an insulating substrate, the thickness of an organic compound layer present between each of said source and drain electrodes and said semiconductor layer is one-half or less the length of molecules forming said organic compound layer.

Owing to the present invention, the amount of electric current of a bottom-contact type organic TFT can be increased so as to be equal to that of a-Si TFT by reducing contact resistance made on the boundary surface between electrode and semiconductor of the bottom-contact type organic TFT. Therefore, semiconductor devices such as display devices, ID tags, sensors and the like can be provided at low cost.

Other objects, features and advantages of the invention will become apparent from the following description of the embodiments of the invention taken in conjunction with the accompanying drawings.

DESCRIPTION OF THE PREFERRED EMBODIMENT

Embodiments of the present invention are explained below in detail with reference to the drawings.

EXAMPLE 1

Figure 1:
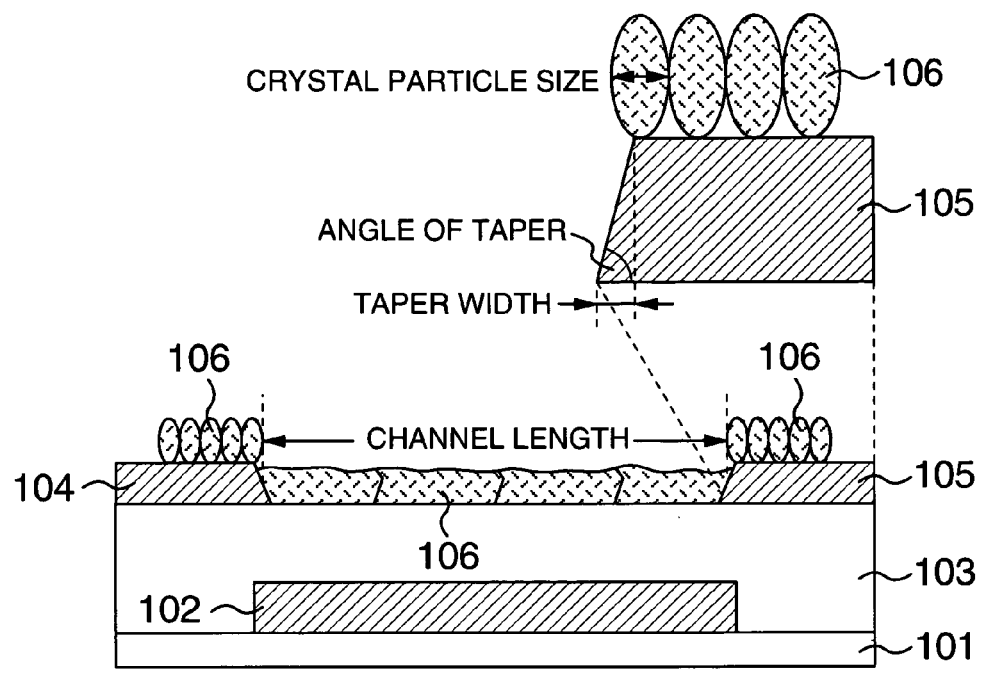
FIG. 1 shows the section structure of a thin-film transistor in one embodiment of the present invention.

A first example of the present invention is explained below with reference to FIGS. 1 to 4. FIG. 1 is a schematic cross-sectional view of a bottom contact type organic TFT obtained according to the present invention. A glass substrate was used as an insulating substrate 101, and a chromium film of 100 nm in thickness was formed on the glass substrate by sputtering. Then, a gate electrode 102 was formed by photolithography. A material for the insulating substrate 101 may be selected from various materials so long as it is an insulating material. Specifically, there may be used, for example, inorganic materials such as glass, quartz, alumina sintered product, etc.; insulating plastics such as a polyimide film, polyester film, polyethylene film, polyphenylene sulfide film, poly(p-xylene) film, etc; and hybrid substrates obtained by combining any of these inorganic materials and any of these insulating plastics. As the gate electrode 102, there may be used metals such as tantalum, aluminum, gold, silver, copper, platinum, palladium, chromium, molybdenum, nickel, etc.; alloys obtained by using these metals; and electroconductive polymers such as polyanilines, polypyrroles, poly(3,4-ethylenedioxythiophene)s (PEDOT), etc. A pattern is formed by ink jet, a printing method or photolithography.

Figure 2:
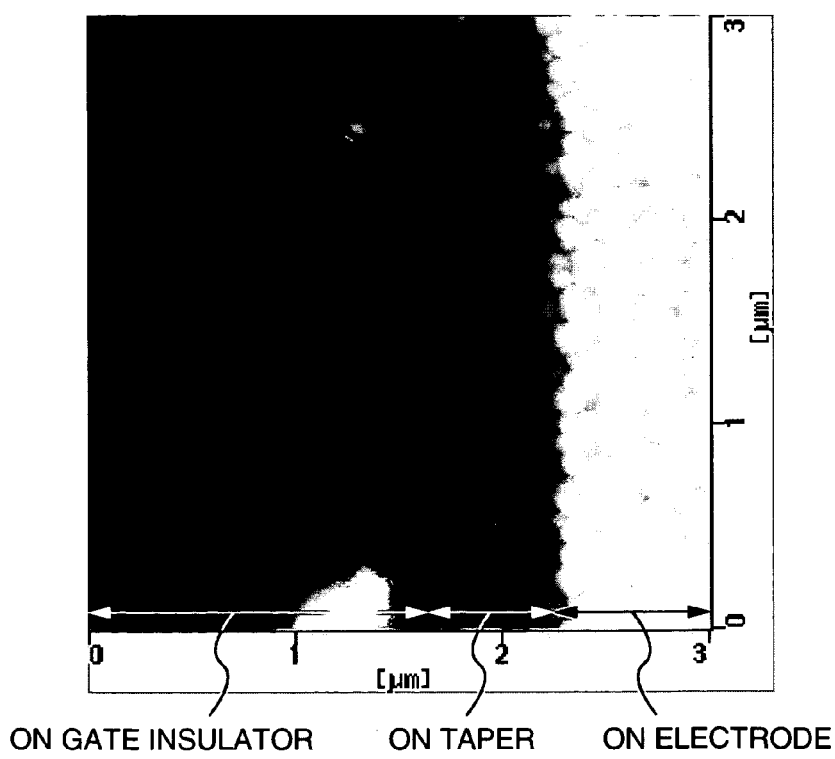
FIG. 2 shows the surface profile of the vicinity of the boundary between a source or drain electrode and a channel.

Next, a SiN film of 300 nm in thickness was formed by CVD to form a gate insulator 103. For example, when tantalum or aluminum is used as the gate electrode 102, tantalum oxide or aluminum oxide, respectively, obtained by subjecting the gate electrode 102 to anodic oxidation may be used as the gate insulator 103. Alternatively, $SiO_2$ or the like may be formed by CVD as the gate insulator 103. It is also possible to apply a polyimide, poly(vinyl phenol) (PVP), poly(vinyl alcohol) (PVA), silicon dioxide or the like and calcine the same at 120° C. to 300° C. Then, a negative-type resist was applied to a thickness of 4 μm by spin coating at 3,000 rpm, calcined at 90° C. for 90 s, exposed to light at 5 to 250 mJ, developed, and then calcined at 110° C. for 60 s to form a resist pattern having reverse-tapered edges. Subsequently, a chromium film of 1 nm in thickness and then a gold film of 100 nm in thickness were evaporated onto the aforesaid resist pattern, and a source electrode 104 and a drain electrode 105, which had a taper region, were formed by a lift-off method. As a material for the source electrode 104 and the drain electrode 105, gold, silver, copper, platinum, palladium, chromium, molybdenum, alloys thereof, ITO, IZO, PEDOT and the like, which have a work function of 4.5 eV or more, are preferably used in order to reduce Schottky barrier between each electrode and an organic semiconductor. Lastly, a pentacene film of 50 nm in thickness was formed by vacuum evaporation at a rate of 1 Å/s in an atmosphere of $2 \times 10^{-6}$ Torr to form a semiconductor layer 106. The semiconductor layer 106 may be formed by applying a soluble pentacene derivative and calcining the same. An organic semiconductor material other than pentacene may be used so long as it forms a polycrystalline structure. As shown in FIG. 1, channel length is defined as the distance between the end of the source electrode 104 and the end of the drain electrode 105. As to taper width, a line perpendicular to the substrate is drawn from the channel's end at the top surface of each electrode which is horizontal with respect to the substrate, and the distance between the channel's end at the undersurface of the electrode and the intersection of the perpendicular line and the undersurface of the electrode was taken as the taper width. FIG. 2 shows the surface profile (an AFM image) of pentacene crystals formed by nucleus growth on the source or drain electrodes and the gate insulator. Under the conditions employed in the present example, the particle size of pentacene crystals grown from a nucleus on each of the source and drain electrodes including its taper is about 50 nm. In this case, the particle size of crystals is defined as the largest diameter of a crystal section that is horizontal with respect to the substrate. On the other hand, pentacene crystals grown from a nucleus on the gate insulator have a size of about 1 μm and are dendritic.

Figure 3:
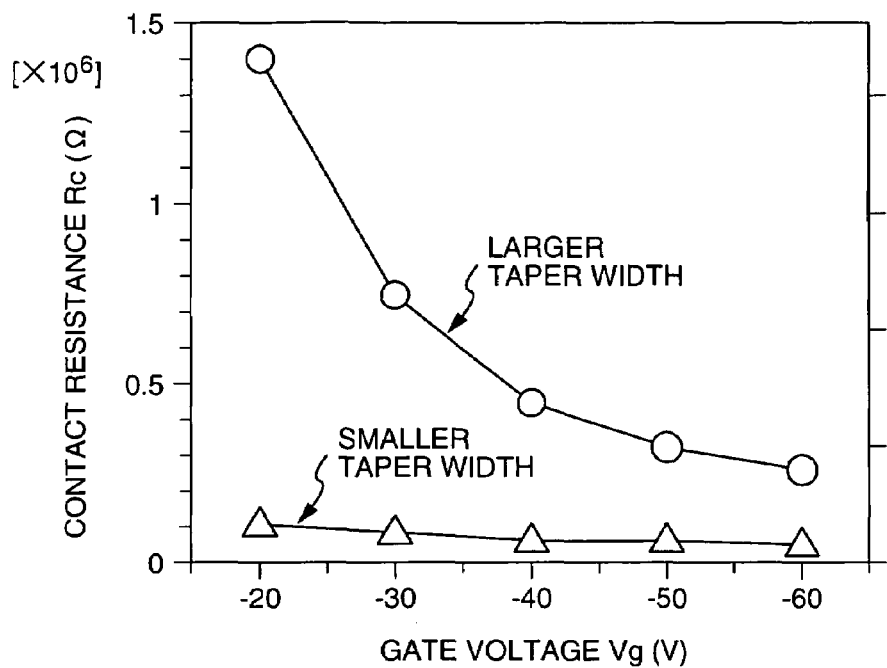
FIG. 3 shows the taper width dependence of the relationship between contact resistance and gate voltage.
Figure 4:
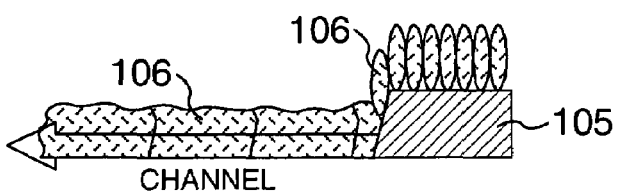
FIGS. 4(a) and 4(b) are schematic cross-sectional view of the vicinity of the boundary between a source or drain electrode and a channel.
Figure 4:
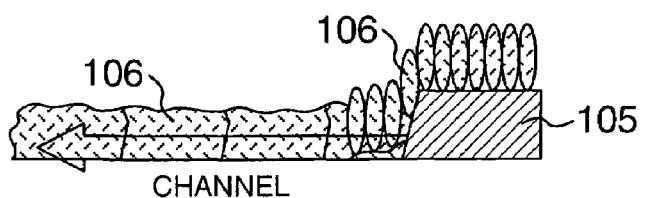

FIG. 3 shows the gate voltage Vg dependence of the contact resistance of two kinds of TFTs different in taper width in the direction parallel to the channel which are produced by the process described above. The taper width was adjusted to about 20 nm to about 600 nm by varying the energy of light exposure of the negative type resist. With an increase of the energy of light exposure of the negative type resist, the angle of reverse taper of the negative type resist becomes obtuser, so that the angle of the taper of each electrode becomes sharper. Thus, the length of the taper portion can be reduced. The taper width can be varied also by adjusting the positions of the substrate and a source for vapor evaporation which are employed at the time of forming the electrodes by vapor evaporation. The contact resistance was determined as follows: elements having a channel length of 5 μm to 400 μm were produced, electric current Ids between the source and drain at a voltage Vds between the source and drain of −20V and a gate voltage Vg of −20, −30, −40, −50 or −60V is plotted along the axis of ordinate, the channel length L is plotted along the axis of abscissa, and the contact resistance was determined from an intercept on the axis of ordinate of a plot obtained as a linear line. The contact resistance of the TFT having a smaller taper width is lower than that of the TFT having a larger taper width. In particular, this tendency becomes more pronounced with a decrease of |Vg|.

In the case of the TFT having a smaller taper width, as shown in FIG. 4(a), semiconductor crystals in contact with a region of the side on the channel side of each of the source and drain electrodes, which region has a height of 10 nm or less above the gate insulator forming the channel, grow from a nucleus on the gate insulator. On the other hand, in the case of the TFT having a larger taper width, as shown in FIG. 4(b), a portion of semiconductor crystals in contact with a region of the side on the channel side of each of the source and drain electrodes, which region has a height of 10 nm or less above the gate insulator forming the channel, grow from a nucleus on the electrode. Therefore, in the case of the TFT having a larger taper width, the number of grain boundaries capable of trapping carriers is increased in the vicinity of each of the source and drain electrode, so that the contact resistance on the boundary surface between each of the source and drain electrode and the semiconductor becomes higher as compared with the TFT having a smaller taper width. Semiconductor crystals in contact with the region at a height of 10 nm or less above the gate insulator forming the channel can be grown from a nucleus on the gate insulator by adjusting the aforesaid taper width in the direction of the channel length to a width smaller than the average particle size of semiconductor crystals on each of the aforesaid source and drain electrodes. In the present example, the taper width is preferably adjusted to 50 nm or less because the size of crystals grown on each electrode is about 50 nm. When each of the source and drain electrodes has an ideal thickness of 50 to 100 nm, the angle of taper θ of each of the source and drain electrodes is preferably 45° or more.

EXAMPLE 2

Figure 5:
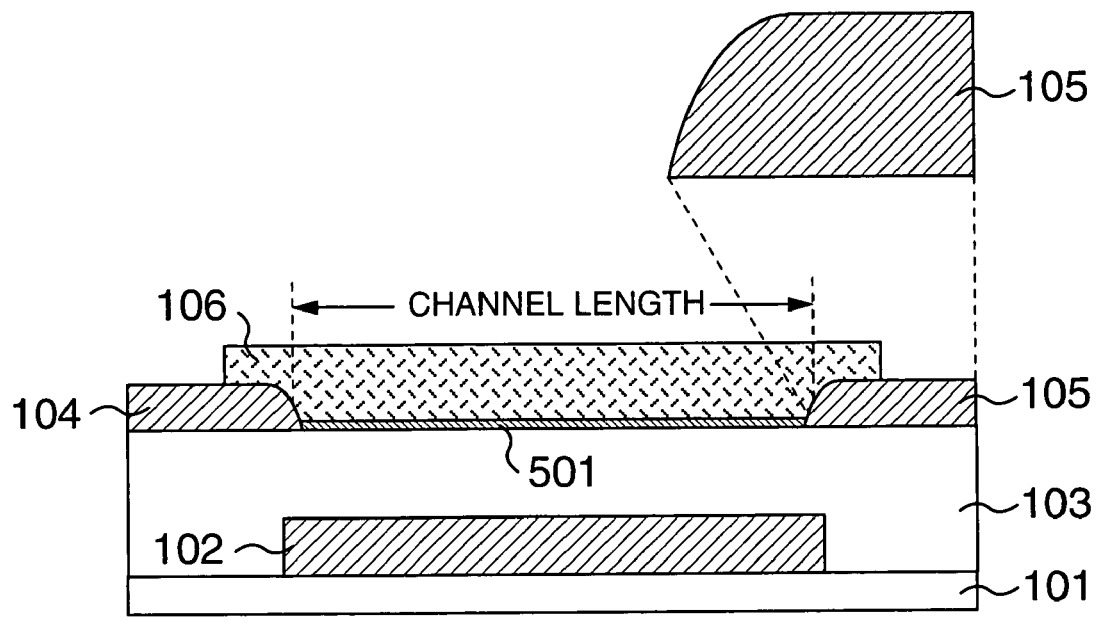
FIG. 5 shows the section structure of a thin-film transistor in another embodiment of the present invention.
Figure 6:
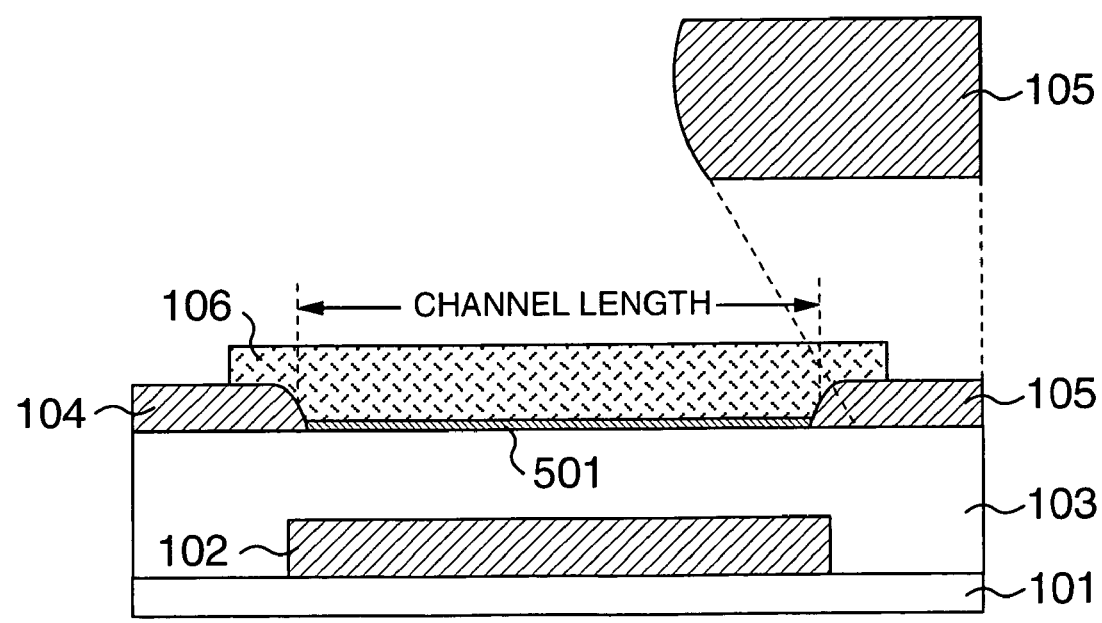
FIG. 6 shows the section structure of a thin-film transistor in further another embodiment of the present invention.

A second example of the present invention is explained below with reference to FIG. 5 and FIG. 6. FIG. 5 is a schematic cross-sectional view of a second example of the semiconductor device of the present invention. A glass substrate was used as an insulating substrate 101, and a chromium film of 100 nm in thickness was formed on the glass substrate by sputtering. Then, a gate electrode 102 was formed by photolithography. As in the first example, a material for the insulating substrate 101 may be selected from various materials so long as it is an insulating material. As the gate electrode 102, other metals, alloys obtained by using these metals, electroconductive polymers and the like may be used as in the first example. As a method for forming the gate electrode 102, any of ink jet, a printing method, and photolithography may be employed. Next, a $SiO_2$ film of 300 nm in thickness was formed by CVD to form a gate insulator 103. The gate insulator 103 may also be formed in the same manner as in the first embodiment. That is, for example, when tantalum or aluminum is used as the gate electrode 102, tantalum oxide or aluminum oxide, respectively, obtained by subjecting the gate electrode 102 to anodic oxidation may be used as the gate insulator 103. Alternatively, SiN or the like may be formed by CVD. It is also possible to apply a polyimide, poly(vinyl phenol) (PVP), poly(vinyl alcohol) (PVA), poly(methyl methacrylate) (PMMA), silicon dioxide or the like and calcine the same at 120° C. to 300° C. Then, octadecylthiol silane (OTS) with a concentration of 1 mMol/l was applied on an area of the gate insulator 103 surface which would become a channel region right over the gate electrode, and rinsing with chloroform was conducted to form a water-repellent adsorbed-molecules layer 501. A material for the adsorbed-molecules layer 501 is not limited to OTS so long as the layer is water-repellent. Next, gold paste with an average particle size of 10 nm obtained by suspending gold in toluene was applied on both ends of monomolecular layer 107 and sintered by heating the substrate on a hot plate at 200° C. for 1 h, to form a source electrode 104 and a drain electrode 105. A material for the source and drain electrodes may be selected from palladium, silver, copper, platinum, tantalum, indium, tin, zinc, aluminum and the like. As the material, fine particles of one of these metals or fine particles of an alloy of two or more of these metals may be used. The average particle size of the fine particles is preferably several nanometers to tens of nanometers. As a solvent, xylene, toluene, ethylbenzene, mesitylene or the like is used. Lastly, a pentacene film of 50 nm in thickness was formed by vacuum evaporation at a rate of 1 Å/s in an atmosphere of $2\times10^{-6}$ to form a semiconductor layer 106. As a material for the semiconductor layer 106, there may be used all semiconductor materials including acene type materials (e.g. pentacene), fluorene type materials (e.g. fluorene-bithiophene (F8T2)), thiophene type materials (e.g. hexylthiophene (P3HT)), etc. As shown in FIG. 5, the end of each electrode could be made into a convex taper by applying the gold paste on the ends of the water-repellent film and calcining the gold paste. By this treatment, the contact resistance was reduced as compared with the case where no water-repellent film is present. It is also possible to form reverse-tapered source and drain electrodes as shown in FIG. 6, by adjusting the surface tension and viscosity of metal ink and the surface energy of the adsorbed-molecules layer. Also in this case, the contact resistance could be reduced.

EXAMPLE 3

Figure 7:
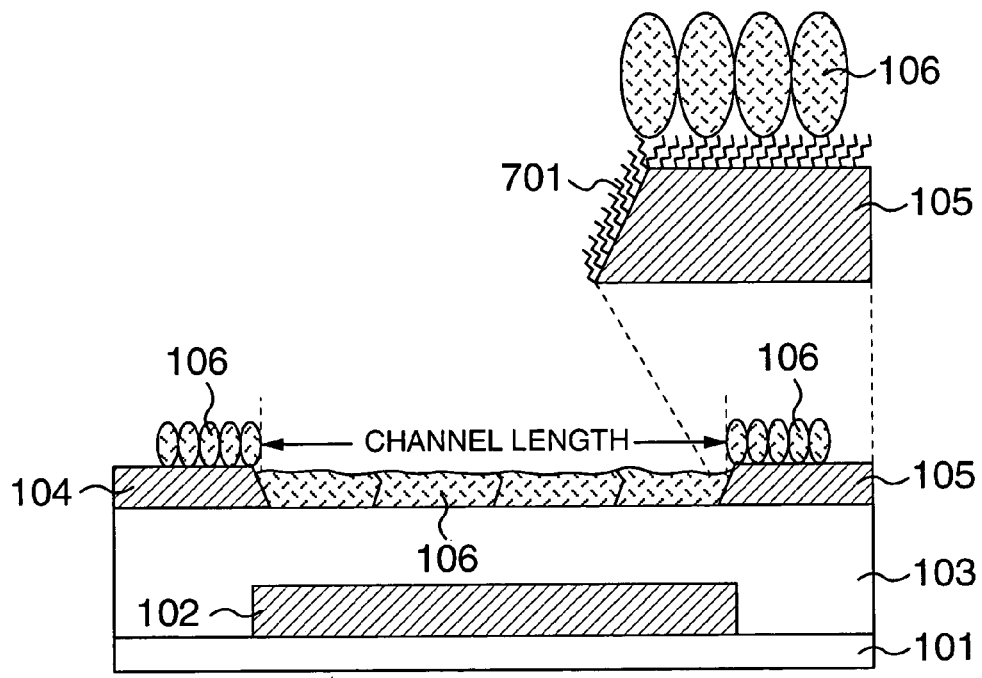
FIG. 7 shows the section structure of a thin-film transistor in still another embodiment of the present invention.

A third example of the present invention is explained below with reference to FIGS. 7 to 10. FIG. 7 is a schematic cross-sectional view of a third example of the semiconductor device of the present invention. A glass substrate was used as an insulating substrate 101, and a chromium film of 100 nm in thickness was formed on the glass substrate by sputtering. Then, a gate electrode 102 was formed by photolithography. As in the first embodiment, a material for the insulating substrate 101 may be selected from various materials so long as it is an insulating material. As the gate electrode 102, other metals, alloys obtained by using these metals, electroconductive polymers and the like may be used as in the first embodiment. As a method for forming the gate electrode 102, any of ink jet, a printing method, and photolithography may be employed. Next, a SiN film of 300 nm in thickness was formed by CVD to form a gate insulator 103. The gate insulator 103 may also be formed in the same manner as in the first embodiment. That is, for example, when tantalum or aluminum is used as the gate electrode 102, tantalum oxide or aluminum oxide, respectively, obtained by subjecting the gate electrode 102 to anodic oxidation may be used as the gate insulator 103. Alternatively, $SiO_2$ or the like may be formed by CVD. It is also possible to apply a polyimide, poly(vinyl phenol) (PVP), poly(vinyl alcohol) (PVA), silicon dioxide or the like and calcine the same at 120° C. to 300° C. Then, a negative-type resist was applied to a thickness of 4 μm by spin coating at 3,000 rpm, calcined at 90° C. for 90 s, exposed to light at 30 mJ, developed, and then calcined at 110° C. for 60 s to form a resist pattern having reverse-tapered edges. Subsequently, a chromium film of 1 nm in thickness and then a gold film of 100 nm in thickness were evaporated onto the aforesaid resist pattern, and a source electrode 104 and a drain electrode 105, which had a taper region, were formed by a lift-off method. As a material for the source and drain electrodes, any of metals (e.g. silver, copper, platinum, palladium and tin) and alloys or mixtures thereof may be used so long as it binds to a sulfur atom covalently. Next, the substrate was immersed in an octadecanethiol solution with a concentration of 0.1 mMol/l for 1 minute and then rinsed with chloroform to form an adsorbed-molecules layer 701 on each of the source electrode 104 and the drain electrode 105. As a material for the adsorbed-molecules layer 701, any material may be used so long as it has a thiol group (—SH). Lastly, a pentacene film of 50 nm in thickness was formed by vacuum evaporation at a rate of 1 Å/s in an atmosphere of $2\times10^{-6}$ to form a semiconductor layer 106. As a material for the semiconductor layer 106, there may be used all semiconductor materials including acene type materials (e.g. pentacene), fluorene type materials (e.g. F8T2), thiophene type materials (e.g. P3HT), etc.

Figure 8:
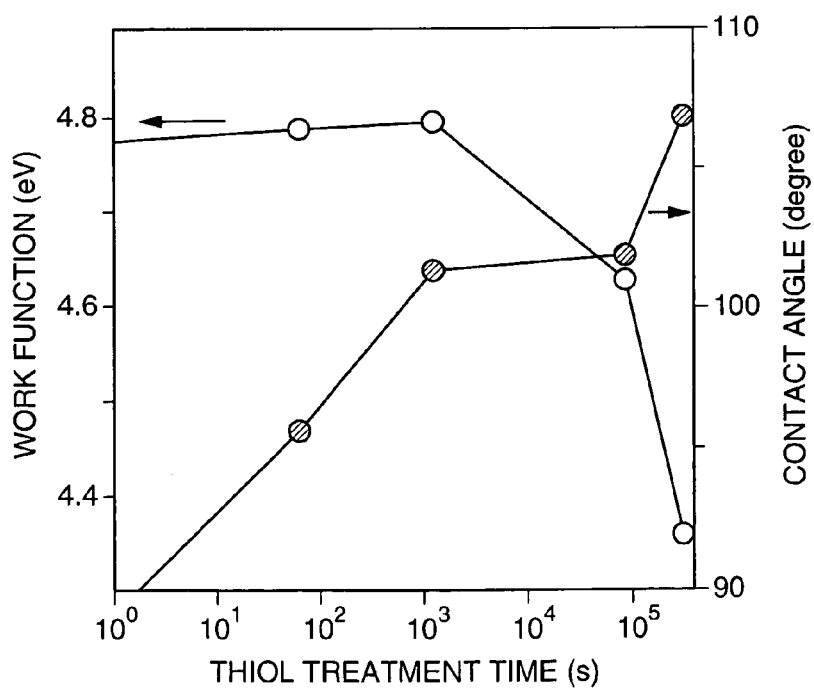
FIG. 8 shows the thiol treatment time dependence of the work function and contact angle of a gold electrode.

FIG. 8 shows the dependence of the work function and contact angle of the gold electrode on the period of time for the immersion in the octadecanethiol solution having a concentration of 0.1 mMol/l. The change of the work function of the gold electrode, which is about 4.8 eV before the immersion in the octadecanethiol solution, is slight when the immersion time is $10^3$ s or less. But the work function is rapidly decreased when the immersion time exceeds $10^3$ s. When the immersion is continued for 4 days, the work function is decreased to about 4.4 eV. On the other hand, the contact angle of the gold electrode, the initial value of which is about 88° before the immersion, is increased immediately after the immersion. That is, in the case of short-time treatment in which the immersion time is $10^3$ s or less, octadecanethiol is adsorbed on the surface of the gold electrode, but the change of work function of the gold electrode, which is responsible for Schottky barrier on the boundary surface between the semiconductor and the electrode, can be limited to 0.2 eV or less. The work function can easily be measured with a photoelectron spectroscope such as AC-2 (mfd. by Riken Keiki Co., Ltd.).

Figure 9:
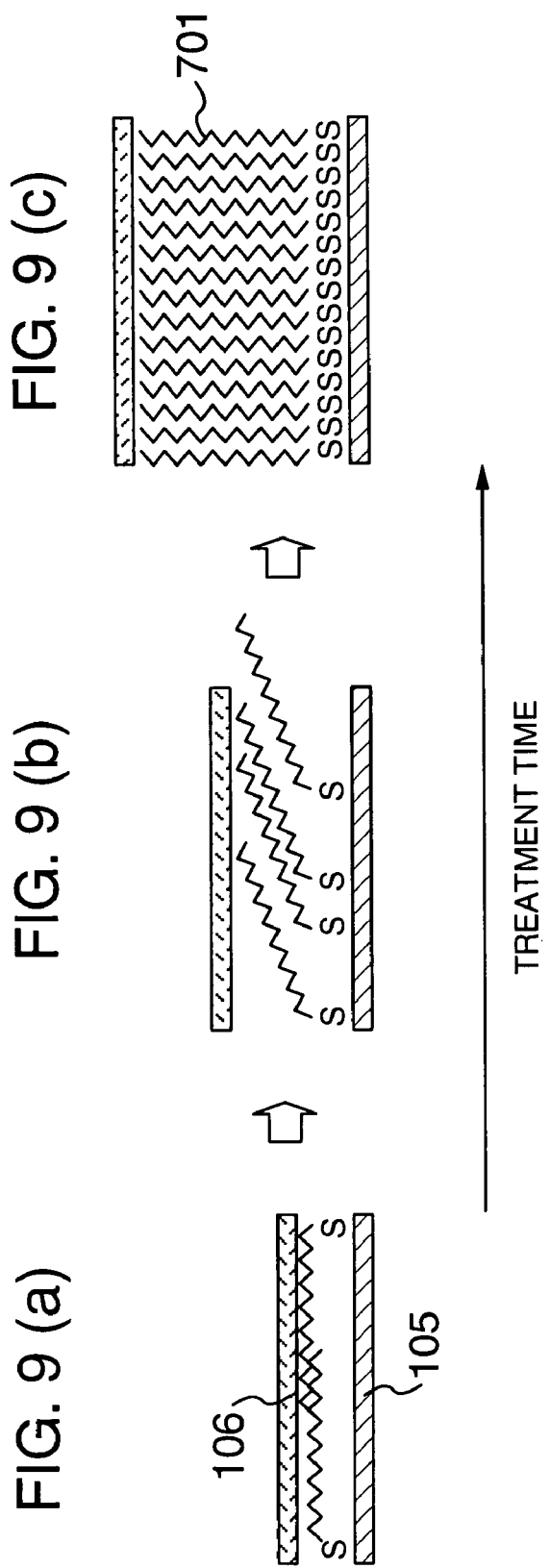
FIGS. 9(a), 9(b) and 9(c) show a model of the structural change of thiol molecules adsorbed on source and drain electrodes.

FIG. 9 is a schematic view showing a manner in which octadecanethiol molecules are adsorbed on the electrode surface and which is dependent on the immersion time. When the immersion time is short, octadecanethiol molecules are sparsely adsorbed in a lying state on the electrode. With an increase of the immersion time, octadecanethiol molecules are densely adsorbed in a standing state on the electrode.

The above phenomenon can be confirmed by a sum frequency spectrogram (SFG) of the electrode surface. With an increase of the immersion time, a peak due to $CH_2$ disappears and a peak due to $CH_3$ increases in size. This fact suggests the following. When the immersion time is short, the amount of molecules adsorbed on the surface is small, so that the degree of freedom of the alkyl chains is high. Therefore, the alkyl chains form a gauche defect and are relatively randomly oriented in a bent state. When the amount of molecules adsorbed on the electrode increases, namely, the density of molecules increases, the alkyl chains do not form a gauche defect owing to their interaction and are linearly stretched, and $CH_3$ groups are oriented at a certain angle at the ends of the alkyl chains. When the alkyl chains are linearly stretched, dipoles due to $CH_2$ groups cancel out one another, so that a peak due to $CH_2$ disappears ($CH_2$ (symmetric): 2850 $cm^{-1}$, $CH_2$ (asymmetric): 2920 $cm^{-1}$, $CH_3$ (Fermi resonance): 2935 $cm^{-1}$, $CH_3$ (asymmetric): 2960 $cm^{-1}$).

Figure 10:
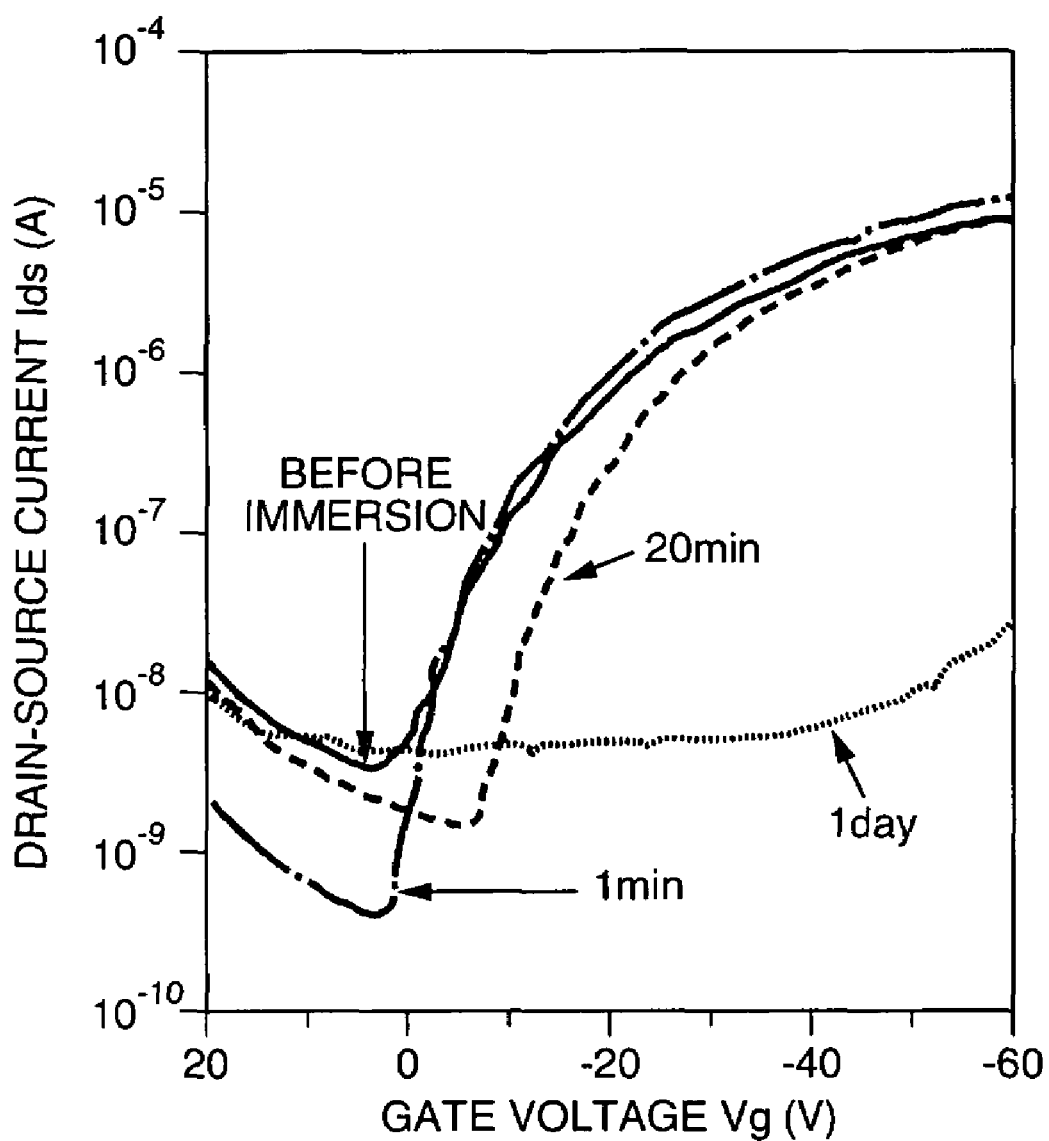
FIG. 10 shows the thiol treatment time dependence of the Ids-Vg characteristics of a thin-film transistor in one embodiment of the present invention.

FIG. 10 shows the dependence of the Vds-Ig characteristics of the thin-film transistor produced by the above process, on the period of time for the immersion in octadecanethiol. The channel length L and channel width W of this element are 400 μm and 2 mm, respectively. When the immersion time is 1 min, the ON-state current at a Vg of −20 V becomes about 50% higher than that before the immersion, and the OFF-state current at a Vg of 5 V becomes about one-tenth that before the immersion. When the immersion time is 1 min, thiol molecules are sparsely adsorbed in a lying state on the electrode as shown in FIG. 9(a), so that the distance between the electrode and the semiconductor is several angstroms. Carriers injected into the semiconductor present at a distance of several angstroms from the source electrode after tunneling through the thiol molecular layer are hardly affected by image force exerted by the electrode. Therefore, the carriers flow into the drain electrode smoothly, so that the ON-state current is increased. From the Vds-Ig characteristics and the result of SFG described above, it was found that the formation of an adsorbed-molecules layer of not more than 10 Å and not less than 1 Å between the electrode and the semiconductor is effective in reducing the contact resistance on the boundary surface between the electrode and the semiconductor. With an increase of the immersion time, the ON-state current increasing effect and the OFF-state current reducing effect are lessened. In the case of an element obtained by adjusting the immersion time to 1 day, the ON-state current is decreased to about one-hundredth that before the immersion. When the immersion time is 1 day, thiol molecules are densely adsorbed in a standing state on the electrode as shown in FIG. 9(c), so that the distance between the electrode and the semiconductor is about 23 Å. When the distance is increased, a high energy is required for tunneling of carriers through the thiol molecular layer from the source electrode, so that the number of carriers that arrive at the drain electrode is decreased. Thiols with a small molecular length, such as methylthiol, ethylthiol, thiophenol and the like were effective in reducing the contact resistance to improve the performance characteristics of TFT, even if molecules thereof are densely adsorbed in a standing state on the electrode as shown in FIG. 9(c).

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device using a thin-film transistor obtained by laminating a gate electrode, a gate insulator, a source electrode, a drain electrode and a semiconductor layer in that order on an insulating substrate, wherein said semiconductor layer is formed of a polycrystalline material, each of said source and drain electrodes has a taper portion on the channel side, and the width of said taper portion in the direction of the channel length is smaller than the average particle size of semiconductor crystals on each of said source and drain electrodes.

2. A semiconductor device according to claim 1, wherein the width of said taper portion in the direction of the channel length is 50 nm or less.

3. A semiconductor device according to claim 1, wherein the angle of the taper portion of each of said source and drain electrodes to the substrate is 45° or more.

4. A semiconductor device according to claim 1, wherein said semiconductor layer is formed of an acene type material.

5. A semiconductor device using a thin-film transistor obtained by laminating a gate electrode, a gate insulator, a source electrode, a drain electrode and a semiconductor layer in that order on an insulating substrate, wherein said semiconductor layer is formed of a polycrystalline material, and the nucleus for growth of semiconductor crystals in contact with at least a region of the side on the channel side of each of said source and drain electrodes, which region has a height of 3 nm or less above the gate insulator, is on the gate insulator.

6. A semiconductor device according to claim 5, wherein said semiconductor layer is formed of an acene type material.

7. A semiconductor device using a thin-film transistor obtained by laminating a gate electrode, a gate insulator, a source electrode, a drain electrode and a semiconductor layer in that order on an insulating substrate, wherein the shape of the side on the channel side of each of said source and drain electrodes is convex upward with respect to the substrate surface.

8. A semiconductor device according to claim 7, wherein an organic compound layer different from said semiconductor layer is present between said gate insulator and said semiconductor layer in the channel region between said source and drain electrodes.

9. A semiconductor device according to claim 7, wherein said source and drain electrodes are formed by applying metal ink.

10. A semiconductor device according to claim 8, wherein the organic compound layer different from said semiconductor layer, which is present between said gate insulator and said semiconductor layer in the channel region between said source and drain electrodes, is a water-repellent adsorbed-molecules layer.

11. A semiconductor device according to and claim 10, wherein the water-repellent adsorbed-molecules layer as the organic compound layer different from said semiconductor layer, which is present between said gate insulator and said semiconductor layer in the channel region between said source and drain electrodes, is a monomolecular film.

12. A semiconductor device using a thin-film transistor obtained by laminating a gate electrode, a gate insulator, a source electrode, a drain electrode, a semiconductor layer and a protective insulating film in that order on an insulating substrate, wherein said semiconductor layer is formed of an organic compound, and each of said source and drain electrodes has a reverse-taper portion.

13. A semiconductor device according to claim 12, wherein an organic compound layer different from said semiconductor layer is present between said gate insulator and said semiconductor layer in the channel region between said source and drain electrodes.

14. A semiconductor device according to claim 12, wherein said source and drain electrodes are formed by applying metal ink.

15. A semiconductor device according to claim 13, wherein the organic compound layer different from said semiconductor layer, which is present between said gate insulator and said semiconductor layer in the channel region between said source and drain electrodes, is a water-repellent adsorbed-molecules layer.

16. A semiconductor device according to claim 15, wherein the water-repellent adsorbed-molecules layer as the organic compound layer different from said semiconductor layer, which is present between said gate insulator and said semiconductor layer in the channel region between said source and drain electrodes, is a monomolecular film.

17. A semiconductor device using a thin-film transistor obtained by laminating a gate electrode, a gate insulator, a source electrode, a drain electrode and a semiconductor layer in that order on an insulating substrate, wherein an organic compound layer different from said semiconductor layer is present between each of said source and drain electrodes and said semiconductor layer, and the average thickness of the organic compound layer is not more than 10 Å and not less than 1 Å, and further wherein a decrease of the work function of said source and drain electrodes caused by the influence of the organic compound layer present between each of said source and drain electrodes and said semiconductor layer is 0.2 eV or less.

18. A semiconductor device according to claim 17, wherein the organic compound present between each of said source and drain electrodes and said semiconductor layer has a thiol group.

19. A semiconductor device according to claim 17, wherein the organic compound present between each of said source and drain electrodes and said semiconductor layer is an alkane thiol.

20. A semiconductor device according to claim 17, wherein said source and drain electrodes are made of gold, silver, copper, platinum, palladium, tin, or an alloy or mixture containing two or more of these metals.

21. A semiconductor device using a thin-film transistor obtained by laminating a gate electrode, a gate insulator, a source electrode, a drain electrode, a semiconductor layer and a protective insulating film in that order on an insulating substrate, wherein the thickness of an organic compound layer present between each of said source and drain electrodes and said semiconductor layer is one-half or less the length of molecules forming said organic compound layer.

22. A semiconductor device according to claim 21, wherein the organic compound present between each of said source and drain electrodes and said semiconductor layer has a thiol group.

23. A semiconductor device according to claim 21, wherein the organic compound present between each of said source and drain electrodes and said semiconductor layer is an alkane thiol.

24. A semiconductor device according to claim 21, wherein said source and drain electrodes are made of gold, silver, copper, platinum, palladium, tin, or an alloy or mixture containing two or more of these metals.

25. A semiconductor device according to claim 21, wherein a decrease of the work function of said source and drain electrodes caused by the influence of the organic compound layer present between each of said source and drain electrodes and said semiconductor layer is 0.2 eV or less.

* * * * *